(12) United States Patent
Bavelloni

(10) Patent No.: US 6,703,824 B2
(45) Date of Patent: Mar. 9, 2004

(54) LOW-COST POWER MEASUREMENT DEVICE FOR A PLURALITY OF MOTORS

(75) Inventor: Franco Bavelloni, San Fermo Della Battaglia (IT)

(73) Assignee: Z. Bavelloni S.p.A., Bregnano (IT)

( * ) Notice: Subject to any disclaimer, the term of this patent is extended or adjusted under 35 U.S.C. 154(b) by 0 days.

(21) Appl. No.: 10/051,100

(22) Filed: Jan. 22, 2002

(65) Prior Publication Data
US 2002/0113604 A1 Aug. 22, 2002

(30) Foreign Application Priority Data
Feb. 16, 2001 (IT) ..................................... MI2001A0331

(51) Int. Cl.⁷ .......................... G01R 21/00; G01R 35/04
(52) U.S. Cl. ........................ 324/142; 324/545; 324/177
(58) Field of Search .................................. 318/650, 550, 318/767, 798, 438, 729; 324/772, 545, 177, 141, 142; 702/60–64

(56) References Cited

U.S. PATENT DOCUMENTS

| 4,447,788 A | 5/1984 | Mundt et al. | |
| 4,896,106 A | * 1/1990 | Voisine et al. | ............... 324/142 |
| 4,989,155 A | * 1/1991 | Begin et al. | ................... 702/62 |
| 5,017,860 A | * 5/1991 | Germer et al. | ............... 324/142 |
| 6,008,605 A | 12/1999 | Breimhorst et al. | |

FOREIGN PATENT DOCUMENTS

GB    2 031 166    4/1980

* cited by examiner

*Primary Examiner*—N. Le
*Assistant Examiner*—Vincent Q. Nguyen
(74) *Attorney, Agent, or Firm*—Guido Modiano; Albert Josif; Daniel O'Byrne

(57) ABSTRACT

A device for measuring the power of a motor, having a measurer for measuring the current sent to the motor and a measurer for measuring the voltage, related to the current, that is sent to the motor, a rephaser for rephasing the waveform of the voltage measured by the voltage measurer and a multiplier suitable to multiply the current measured by the current measurer with the voltage rephased by the rephaser, the output signal of the multiplier being processed in order to obtain active power.

12 Claims, 1 Drawing Sheet

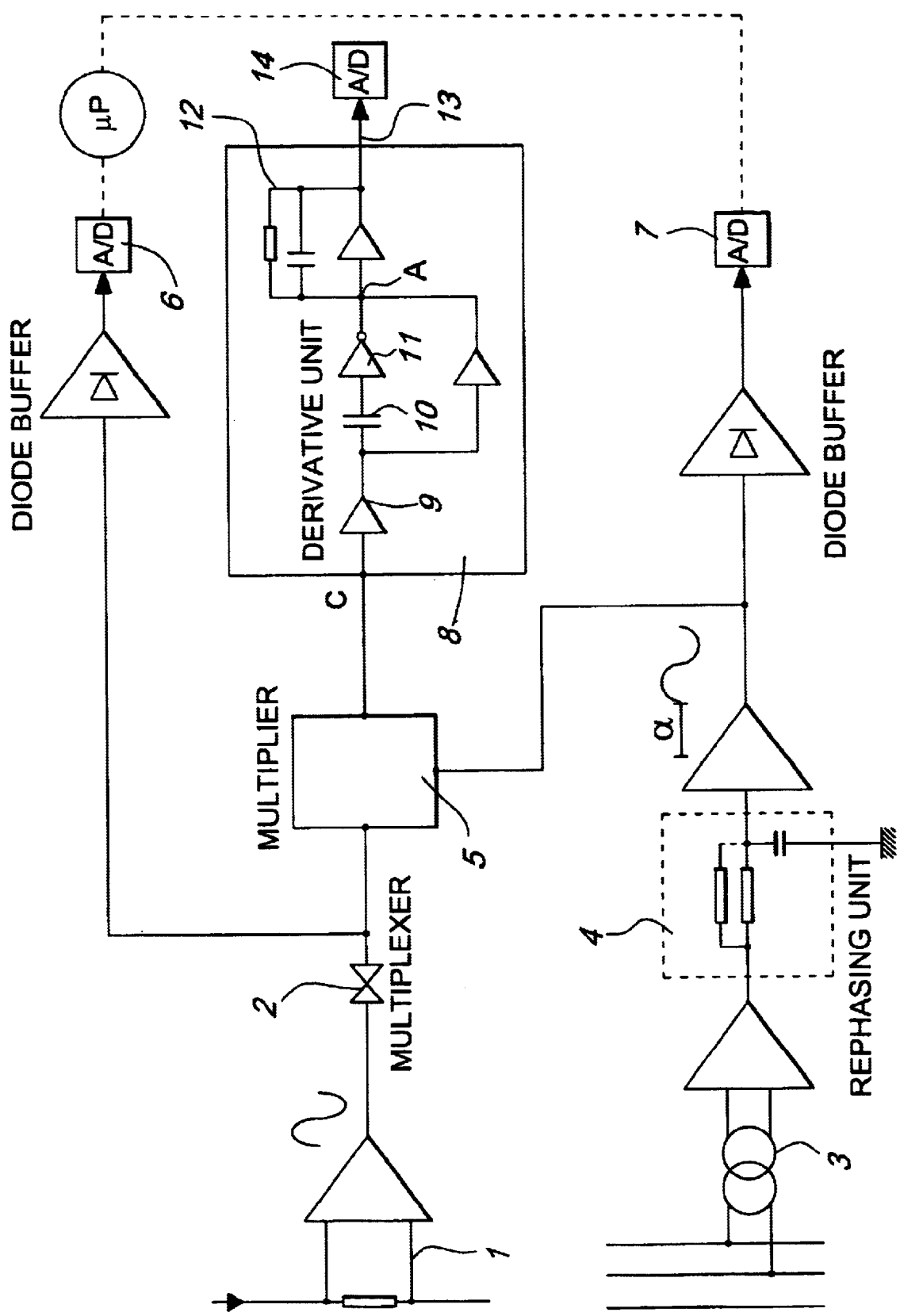

LOW-COST POWER MEASUREMENT DEVICE FOR A PLURALITY OF MOTORS

BACKGROUND OF THE INVENTION

The present invention relates to a low-cost device for power measurement of a plurality of motors. More particularly, the invention relates to a power measurement device for controlling motors, such as for example motors for driving grinding wheels used in machines for working glass, marble, et cetera.

It is known that in order to effectively control each motor of an apparatus, which in turn controls a working element of any sort, it is necessary to control in a substantially accurate manner the electric power that is supplied to the motor and is converted, minus losses, into mechanical power.

In electrical power measurement devices, this is normally done by measuring, for each motor, the current related to one or more phases (if a three-phase system is used) and the "star" voltage that corresponds to those given phases or to two connected phases, subsequently measuring the phase shift between the voltage and the current.

Substantially, in addition to measuring the effective values of these currents and voltages, the zero crossings of said currents and voltages are detected.

The measurement of the phase shift between the voltage and the current for each motor, for example, is obtained by means of counters located on an appropriate clock (which emits pulses at a given frequency), with counter setting/resetting activated by the zero crossings of the measured current and measured voltage, so as to measure the phase shift between the voltage and the current.

Substantially, one measures the distance between a zero crossing of the current or voltage and a subsequent zero crossing (for example at the end of the period of the voltage or current), counting the intervening clock pulses.

The device that provides this is capable of giving a highly accurate measurement of the power supplied to the motor, also by using a microprocessor that accordingly receives in input the effective voltage and current values together with the zero crossing values of the voltage and current, in order to then calculate the phase shift between the voltage and the current.

However, the devices that provide the above described power measurement are expensive from the point of view of components and therefore for many applications that do not require very high measurement precision they are in a way "oversized" and accordingly increase needlessly the cost of an apparatus.

SUMMARY OF THE INVENTION

The aim of the present invention is to provide a power measurement device for motors and the like that is capable of providing a measured power value that is in any case sufficiently precise to control the motor but has a lower cost than known devices.

Within this aim, an object of the present invention is to provide a motor power measurement device that is capable of using a microprocessor with a firmware whose complexity is reduced considerably with respect to the firmware of microprocessors used in known devices.

Another object of the present invention is to provide a motor power measurement device in which the calculation of the phase shift between the voltage and the current of each motor is performed in a simpler way than in known devices.

Another object of the present invention is to provide a power measurement device for motors that is highly reliable, relatively simple to provide and at competitive costs.

This aim and these and other object that will become better apparent hereinafter are achieved by a device for measuring the power of a motor, comprising means for measuring the current sent to the motor and means for measuring the voltage, related to said current, that is sent to the motor, characterized in that it comprises rephasing means suitable to rephase the waveform of said voltage measured by said voltage measuring means and multiplier means suitable to multiply said current measured by said current measuring means by said voltage rephased by said rephasing means, the output signal of said multiplier means being processed in order to obtain the active power.

BRIEF DESCRIPTION OF THE DRAWINGS

Further characteristics and advantages of the invention will become better apparent from the description of a preferred but not exclusive embodiment of the device according to the invention, illustrated only by way of non-limitative example in the accompanying drawing, wherein the only FIGURE is a schematic circuit diagram of the device according to the present invention.

DESCRIPTION OF THE PREFERRED EMBODIMENTS

With reference to the FIGURE, the device comprises means for measuring the current of a phase, designated by $I_{1 \ldots n}$, referenced by the numeral 1 and suitable to measure the current of a phase of each motor sequentially, with multiplexing means 2 suitable to multiplex the various currents in order to then perform power calculation, as described in detail hereinafter.

The device further comprises voltage measuring means, designated by the reference numeral 3, which are suitable to measure a voltage V of one of the phases R, S and T, or a line-to-line voltage between said phases, if the system is three-phase.

The measurement of the current is phase shifted with respect to the measurement of the voltage obtained by the measuring means 3 not only due to the inductive nature of the load but also due to the possible phase shift between the current and the voltage being measured.

Therefore, rephasing means 4 are arranged in a cascade configuration with respect to the voltage measuring means 3 and are conveniently constituted by an RC circuit, which allows to introduce a preset phase shift α in the waveform of the measured voltage that it suitable to compensate for the advance of the line-to-line or concatenated voltage star with respect to the advance of the star voltages.

Ultimately, therefore, the circuit according to the invention allows to obtain a current waveform with a corresponding voltage waveform of which a phase shift is already performed.

Then, the two waveforms, which are now mutually phase shifted only due to the load characteristics (cos Φ), are introduced in multiplier means 5, which are suitable to emit in output a waveform determined by the product of the voltage and current waveforms, respectively, i.e., a waveform that indicates the apparent power.

The waveform of the current and the waveform of the voltage are sent to respective A/D converters, designated by the reference numerals 6 and 7, which are interfaced with a microprocessor, which is adapted to coordinate the multiplexer 2 for selecting the currents $I_{1...n}$ that arrive from the plurality of motors.

Means 8 suitable to receive the active power are arranged in a cascade configuration with respect to the multiplier means 5 and comprise a first amplifier 9, a derivative unit 10, constituted for example by a capacitor, an inverter 11 that is cascade-connected to the capacitor 10, and an adder node A at which the waveform of the power in output from the inverter 11 is added to the waveform of the power in output from the amplifier 9.

An amplifier having a limited passband (filter) 12 then allows to obtain in output the active power, designated by the reference numeral 13.

Substantially, the derivative unit allows to obtain a continuous power level, eliminating from the waveforms at the node C the harmonic component equal to VI cos $[2(\omega t+\Phi)]$. Then a microprocessor, which is not shown and is interfaced with A/D converters 6, 7 and 14, divides, by performing appropriate software instructions and on the basis of the effective current and effective voltage, the active power into losses and mechanical power available at the motor shaft.

In practice it has been found that the device according to the invention fully achieves the intended aim and objects, since it allows to measure the power sent to each motor without the aid of a microprocessor having complicated and expensive firmware, since the microprocessor in this case, only has to coordinate the currents that arrive from the various motors, and the operation for multiplying the voltage by the current for each motor is performed in multiplier means that are external to the microprocessors.

The device thus conceived is susceptible of numerous modifications and variations, all of which are within the scope of the appended claims; all the details may further be replaced with other technically equivalent elements.

The disclosures in Italian Patent Application No. MI2001A000331 from which this application claims priority are incorporated herein by reference.

What is claimed is:

1. A device for measuring the power of a motor, comprising: measuring means for measuring a current (sent to at least one motor);
   measuring means for measuring a voltage, related to said current, (that is sent to said at least one motor);
   analog rephasing means for rephasing a waveform of said voltage measured by said voltage measuring means; and
   analog multiplier means for multiplying said current measured by said current measuring means with said voltage rephased by said rephasing means and providing an analog output signal, the output signal of said multiplier means being processed in order to obtain active power in the analog domain.

2. The device of claim 1, comprising: multiplexer means, for selecting one current at a time among a plurality of currents (related to a plurality of motors), which are provided in a cascade configuration with respect to said current measuring means.

3. The device of claim 1, wherein said rephasing means comprises an RC circuit.

4. The device of claim 1, including processing means for processing said output signal of said multiplier means that comprise: amplification and filtering means, a first amplifier, derivative means and inverter means, said derivative and inverter means being connected in output to said first amplifier, an output signal of said first amplifier being added to an output signal of said inverter means for subsequent sending to said amplification and filtering means in order to obtain said active power.

5. The device of claim 4, comprising a microprocessor, said active power, said current measured by said current measuring means and said voltage measured by said voltage measuring means being sent to said microprocessor.

6. The device of claim 5, wherein said rephasing means are provided so as to introduce a phase shift in said voltage measured by said voltage measuring means, said phase shift compensating any advance of a star of concatenated voltages with respect to star voltages.

7. A device for measuring the power of a motor, comprising:
   measuring means for measuring a current;
   measuring means for measuring a voltage, related to said current;
   rephasing means for rephasing a waveform of said voltage measured by said voltage measuring means; and
   multiplier means for multiplying said current measured by said current measuring means with said voltage rephased by said rephasing means and providing an output signal, the output signal of said multiplier means being processed in order to obtain active power; the device further comprising processing means for processing said output signal of said multiplier means that comprise:
   amplification and filtering means, a first amplifier, derivative means and inverter means, said derivative and inverter means being connected in output to said first amplifier, an output signal of said first amplifier being added to an output signal of said inverter means for subsequent sending to said amplification and filtering means in order to obtain said active power.

8. The device of claim 7, comprising: multiplexer means for selecting one current at a time among a plurality of currents, which are provided in a cascade configuration with respect to said current measuring means.

9. The device of claim 7, wherein said multiplier means are provided as analog multiplier means.

10. The device of claim 7, wherein said rephasing means comprises an RC circuit.

11. The device of claim 7, comprising a microprocessor, said active power, said current measured by said current measuring means and said voltage measured by said voltage measuring means being sent to said microprocessor.

12. The device of claim 7, wherein said rephasing means are provided so as to introduce a phase shift in said voltage measured by said voltage measuring means, said phase shift compensating any advance of a star of concatenated voltages with respect to star voltages.

* * * * *